United States Patent [19]
Reele et al.

[11] Patent Number: 5,235,140
[45] Date of Patent: Aug. 10, 1993

[54] ELECTRODE BUMP FOR FLIP CHIP DIE ATTACHMENT

[75] Inventors: Samuel Reele; Thomas R. Pian, both of Rochester, N.Y.

[73] Assignee: Eastman Kodak Company, Rochester, N.Y.

[21] Appl. No.: 886,585

[22] Filed: May 21, 1992

[51] Int. Cl.$^5$ ............................................. H05K 1/00
[52] U.S. Cl. .................................... 174/267; 174/259
[58] Field of Search ....................... 174/260, 259, 267; 439/68, 69, 70; 228/180.2

[56] References Cited

U.S. PATENT DOCUMENTS

| | | |
|---|---|---|
| 3,119,172 | 1/1964 | Mazenko et al. |
| 4,426,773 | 1/1984 | Hargis ................................... 29/832 |
| 4,899,174 | 2/1990 | Newman et al. ............... 346/107 R |
| 4,970,571 | 11/1990 | Yamakawa et al. .................. 357/71 |
| 4,980,034 | 12/1990 | Volfson et al. ..................... 264/38.4 |
| 4,991,000 | 2/1991 | Bone et al. ............................. 357/75 |
| 5,027,188 | 6/1991 | Owada et al. ......................... 357/68 |
| 5,029,529 | 7/1991 | Mandigo et al. |
| 5,147,084 | 9/1992 | Behun et al. |

Primary Examiner—Leo P. Picard
Assistant Examiner—Cheryl R. Figlin
Attorney, Agent, or Firm—Norman Rushefsky

[57] ABSTRACT

A large electrode bump is generated on a substrate such as a circuit board. A small electrode bump is then formed on the large bump. Preferably a barrier layer is deposited over the large bump prior to formation of the small bump. In this case the small bump is formed on the barrier layer over the large bump. In one embodiment, the small bump is formed by applying a sacrificial layer on the large bump. A window is created in the sacrificial layer. A spring may optionally be inserted in the window. The window is then filled with a conductive material. Finally, the sacrificial layer is removed to reveal the small bump. In another embodiment, a small bump is formed on a semiconductor die and a larger bump is formed on a substrate. The semiconductor die is mounted on the substrate such that the bump on the die contacts the larger bump.

11 Claims, 2 Drawing Sheets

ELECTRODE BUMP FOR FLIP CHIP DIE ATTACHMENT

TECHNICAL FIELD OF THE INVENTION

The present invention relates to electrode bumps for flip chip mounted devices, such as integrated circuits (ICs), and to methods of forming such bumps.

BACKGROUND ART

In recent years, with the advances made in the miniaturization of electronic devices, integration densities of IC (SSI, MSI, LSI, and VLSI) chips have been greatly increased. In mounting of semiconductor devices, such as ICs, onto a substrate, the distance (pitch) between electrode bumps has been reduced while the number of input/output(I/O) terminals has been increased. In card type calculators and IC cards, a demand has arisen for developing low-profile products which require short pitches.

Wireless bonding, such as tape automated bonding (TAB) and flip chip, can advantageously realize collective bonding of bumps with high-precision alignment between bumps, low-profile automatic mounting of semiconductor elements and high reliability. Therefore, wireless bonding has become a mainstream mounting techniques for IC chips.

In performing wireless bonding, these electrode bumps are generally formed on a substrate or an IC chip. The known bumps and methods of forming them suffer from several drawbacks. It is difficult to obtain a significant bump height without affecting bump series impedance and inductance. Obtaining a bump aspect ratio of greater than 1.5:1 is difficult if not impossible to achieve using present methods of bump formation such as, conventional one-step photolithographic bumping and liquid metal ion source bumping processes. A further problem is temperature coefficient of expansion (TCE) mismatch between the substrate and the semiconductor die mounted to the substrate. For example, the IBM C4 process is not optimal for mounting semiconductor die that are greater than 600 mils because of TCE mismatch. This problem is exacerbated in I/O pads located in corners of the substrate because shear forces due to TCE mismatch are in multiple directions.

SUMMARY OF THE INVENTION

In view of the foregoing discussion, an object of this invention is to provide an electrode bump and method of making the bump which overcome the deficiencies of the prior art.

In the practice of the invention a large electrode bump is formed on a substrate. A small electrode bump is then formed on the large bump. Preferably an electrically conductive barrier layer is deposited over the large bump prior to formation of the small bump. In a particularly preferred embodiment of the invention, the small bump is formed by applying a sacrificial layer on the large bump. A window is created in the sacrificial layer. A spring may optionally be inserted in the window. The window is then filled with an electrically conductive material. Finally, the sacrificial layer is removed to reveal the small bump. TCE mismatch can be accommodated by optimal choice of bump materials.

The invention, and its objects and advantages, will become more apparent in the detailed description of the preferred embodiments presented below.

BRIEF DESCRIPTION OF THE DRAWINGS

In the detailed description of the preferred embodiments of the invention presented below, reference is made to the accompanying drawings, in which.

BEST MODE FOR CARRYING OUT THE INVENTION

Figure 1A:
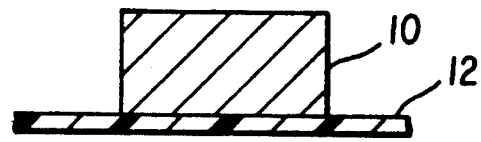
FIGS. 1(a)–(f) are side sectional views illustrating a series of steps in a method of forming an electrode bump representative of the present invention.
Figure 1B:
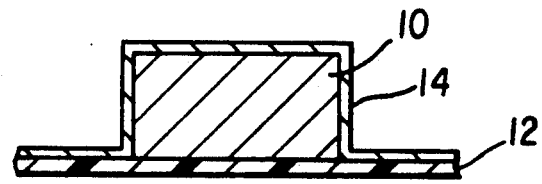
Figure 1C:
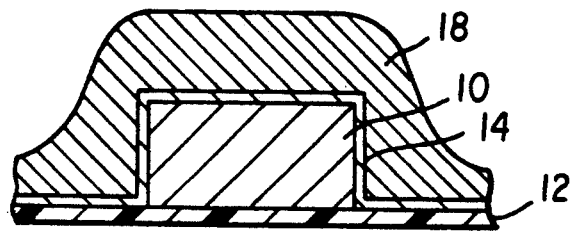
Figure 1D:
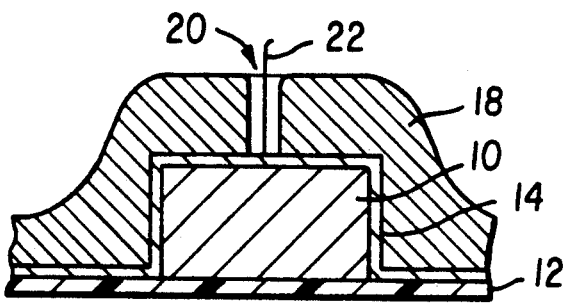
Figure 1E:
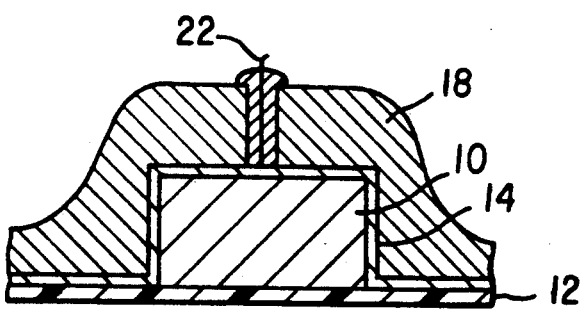
Figure 1F:
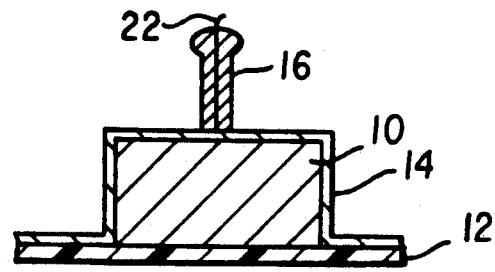

Although the following describes the creation of an electrode bump on a substrate, it is contemplated that the bump can instead be formed on a semiconductor die.

Referring to FIG. 1, a relatively large electrically conductive electrode bump 10 is formed on a substrate 12 by preferably a photolithographic, plating or liftoff process. Substrate 12 includes a number of metal and dielectric layers, and a core. Typically, these metal and dielectric layers are on the order of 5 to 10 kilo Angstroms thick. Substrate 12 is used in a circuit application.

Bump 10 is made of a relatively soft, electrically conductive material such as gold. The size of bump 10 is determined by die pad pitch and process resolution constraints for minimum bump-to-bump spacings to ensure no shorting between bumps, and ensure the required leakage and crosstalk requirements. For example, if the pitch between large bumps was 2 mils, the length and width of the large bumps would preferably be about 25 microns. If the pitch is 4 mils the length and width would preferably be about 50 microns. The height of large bump 10 is a function of circuit topology and substrate topology. Typically, the height of bump 10 is about 10 microns. In selecting the size of bump 10 virtually no consideration is made with respect to the die topology (such as bond pad to final passivation distance or the bond pad to shield metal distance).

An electrically conductive barrier layer 14 can optionally be deposited over large bump 10. Barrier layer is made of a hard material such as platinum, palladium, nickel, tungsten and/or titanium. The purpose of barrier layer 14 is to aid in repairability and offer testability options. The barrier layer allows the substrate to be tested via mechanical contact (or non-contact) without affecting the bump interface. Testing of the substrate must be accomplished with extreme care or may not even be possible with other methods of bump generation.

A small electrode bump 16 is then formed on large bump 10 or, if a barrier layer is used, on barrier layer 14 over the large bump. The size of small bump 16 is determined by the die topology (bond pad to shield metal) and the optimal size required to have a desired pressure yield the correct small bump compression without causing die shorts. The height of small bump 16 is determined by several factors such as the compression distance required for a fixed applied pressure and the bond pad surface to highest die feature clearance requirement. Small bump 16 can be generated by liquid metal ion source or photolithographic processes.

Preferably, small bump 16 is generated by the following process. A sacrificial layer 18 is applied on large bump 10 or, if a barrier layer is used, on the barrier layer. The thickness of layer 18 is selected to match the desired height of the small bump. The preferred height of small bump 16 is about 10 microns. Sacrificial layer 18 is preferably made of a material such as a photoresist or polyimide, and may be applied by multiple spin-on processes or spray processes. A window 20 is created in layer 18 by positive photosensitive sacrificial layer definition. This is accomplished by exposing layer 18 to actinic (e.g. visible or ultraviolet) radiation in all areas except where window 20 is to be located. This exposure causes a chemical crosslinking of the material so exposed. Layer 18 is then exposed to an aqueous solution for positive photoresist (or a solvent if a negative photoresist is used). This exposure dissolves layer 18 only where it is not exposed to the radiation. The result is window 20. A batch laser process can also be used to create window 20. The length and width of window 20 is approximately equal to the final small bump length and width. For a 2 mil bump pitch the length and width of small bump 16 are each preferably about 10 microns while for a 4 mil pitch the length and width are each preferably about 20 microns. Preferably, the aspect ratio (height/width or length) of the small bump is about 1:1. Further, both bump pitch, i.e. spacing between bumps, and size can be optimized.

An electrode spring 22 can optionally be inserted in window 20 either prior, during or after window 20 is filled with a conductive material. Because the spring extends above small bump 16 the spring can provide a mechanical scrubbing action to remove oxides from the die bond pad for optimal conditions for adhesive flip chip die attachment. Window 20 is then filled with an electrically conductive material 20 (amalgam or conductive epoxy), such as gold, by capillary insertion or a blot printing process. Sacrificial layer 18 is then removed by contacting it with a solvent, such as a strong acid or alkali solution, or by a plasma etching technique. This exposes bump 16.

Figure 2A:
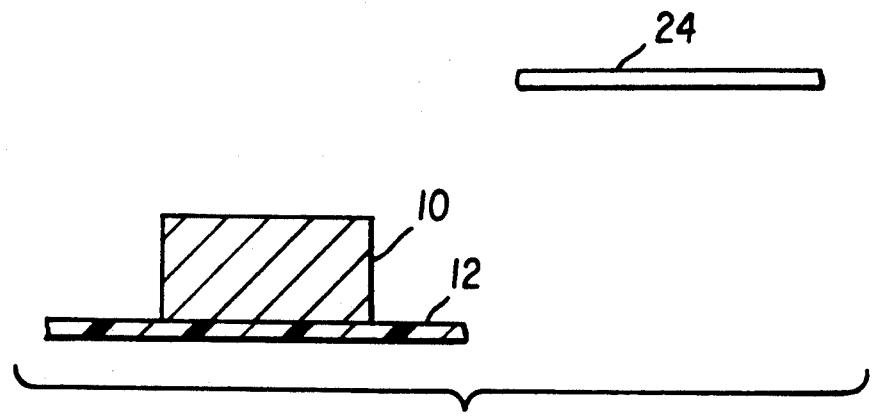
FIGS. 2(a)–(c) are side sectional views illustrating a series of steps in an alternative method of the invention for forming an electrode bump representative of the present invention.
Figure 2B:
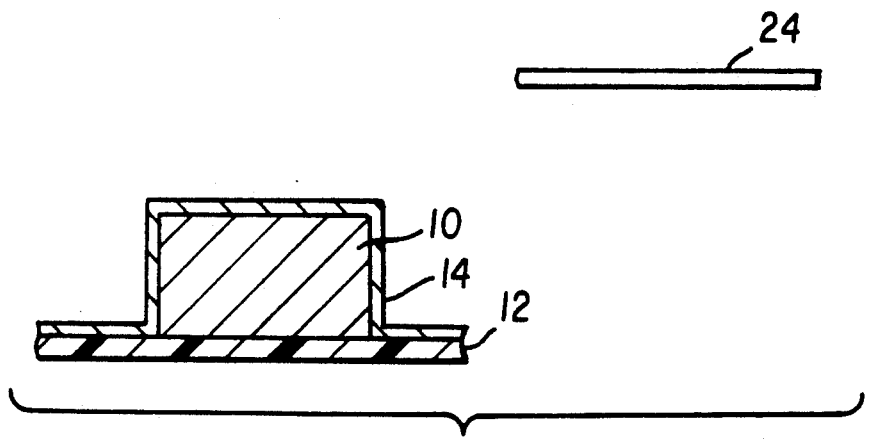
Figure 2C:
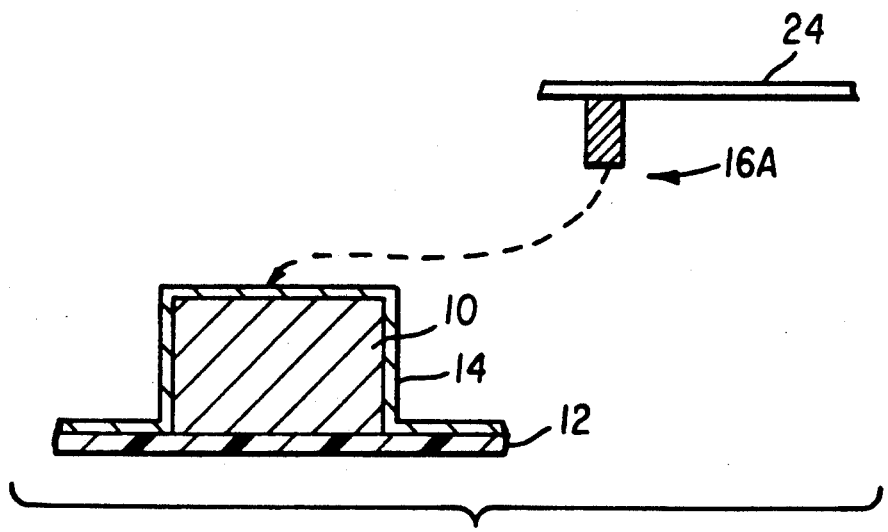

Present state-of-the-art processes (with respect to bump generation for flip chip die attachment) generate the bump either on the substrate or on the die prior to the flip chip assembly process. Although the process described above is stated as generating the large and small bumps on the substrate prior to assembly, a hybrid approach of generating the large bump on the substrate and small bump on another substrate such as the die itself is contemplated and is illustrated in FIGS. 2(a)–(c). In this hybrid approach, large bump 10 and barrier layer 14 are formed on substrate 12 as previously described. A small bump 16A is formed on a substrate such as a semiconductor die 24 by the same process used to form small bump 16 described above, i.e. steps FIG. 1(c)–(f). When die 24 is flip chip mounted and adhesively attached to substrate 12, small bump 16A will contact barrier layer 14 as indicated by dashed line 26. An advantage to this approach is that die 24, with small bump 16A attached, can be probed without any mechanical damage to the die bond pad itself from which the small bump extends.

In both methods of forming an electrode bump described above, repairability is optimized since one is able to remove the flip chip assembly die from the substrate by chemically or mechanically severing the large bump from the barrier layer. The small bump to die bond pad interface is not disturbed because both the small bump and the barrier layer are removed with die assembly. This allows rigorous testing of both the semiconductor die and substrate interconnect without compromising the reliability of the electrode bumps.

The invention has been described in detail with particular reference to preferred embodiments thereof, but it will be understood that variations and modifications can be effected within the spirit and scope of the invention.

What is claimed is:

1. A composite conductive electrode bump comprising the combination of:
   a larger electrically conductive bump located on a substrate;
   a smaller electrically conductive bump located on said larger bump, said smaller bump having a width which is significantly smaller than the width of said larger bump; and
   means, including an electrode spring that extends externally from said smaller bump, for providing a mechanical scrubbing action to remove oxides from a die bond pad contacted by said electrode spring, the majority of said electrode spring being imbedded in said smaller bump.

2. The electrode bump as defined in claim 1 further comprising an electrically conductive barrier layer, said barrier layer being located on said large bump, said small bump being located on said barrier layer over said large bump.

3. The electrode bump as defined in claim 1 wherein said large bump is made of gold.

4. The electrode bump as defined in claim 1 wherein said larger bump has a width of between about 25–50 microns.

5. The electrode bump as defined in claim 1 wherein said larger bump has a height of about 10 microns.

6. The electrode bump as defined in claim 2 wherein said barrier layer is made of a material selected from the group consisting of platinum, palladium, nickel, tungsten, titanium and alloys of these materials.

7. The electrode bump as defined in claim 1 wherein said smaller bump is about 10 microns in height.

8. The electrode bump as defined in claim 1 wherein said smaller bump has a width of between about 10–20 microns.

9. The electrode bump as defined in claim 1 wherein said smaller bump has an aspect ratio of about 1:1.

10. The electrode bump as defined in claim 1 wherein said smaller bump is made of a material including an amalgam or conductive epoxy.

11. The electrode bump as defined in claim 10 wherein said smaller bump is made of a material including gold.

* * * * *